US006950352B1

(12) United States Patent
Jung et al.

(10) Patent No.: US 6,950,352 B1
(45) Date of Patent: Sep. 27, 2005

(54) METHOD AND APPARATUS FOR REPLACING A DEFECTIVE CELL WITHIN A MEMORY DEVICE HAVING TWISTED BIT LINES

(75) Inventors: Chang Ho Jung, Ft. Collins, CO (US); Jeff S. Brown, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 118 days.

(21) Appl. No.: 10/716,263

(22) Filed: Nov. 18, 2003

(51) Int. Cl.[7] ................................................ G11C 7/00
(52) U.S. Cl. .................. 365/200; 365/201; 365/230.06
(58) Field of Search ................................ 365/200, 201, 365/230.06, 189.05

(56) References Cited

U.S. PATENT DOCUMENTS 6,018,480 A 1/2000 Wik et al.
6,282,113 B1 8/2001 DeBrosse
6,292,383 B1 9/2001 Worley
6,560,150 B2 * 5/2003 Abedifard .................. 365/201

* cited by examiner

*Primary Examiner*—David Lam
(74) *Attorney, Agent, or Firm*—Conley Rose, P.C.

(57) ABSTRACT

A method and apparatus is provided for replacing defective storage cells within a memory device having twisted bit lines. If a defective storage cell is discovered, the row containing that storage cell can be re-mapped to the neighboring row or the memory array. Each successive neighboring row is also re-mapped to succeeding neighboring rows by incrementing or decrementing the row addresses. This will cause the addresses to essentially shift one address value toward the redundant set of rows, and one redundant row will be subsumed for every defective row within the array. Whenever an address is shifted across a twist region, the data of that address is purposely inverted in binary voltage value (i.e., converted from a binary 1 to a binary 0, and vice versa) to accommodate the twisting of the true and complementary bit line locations.

20 Claims, 3 Drawing Sheets

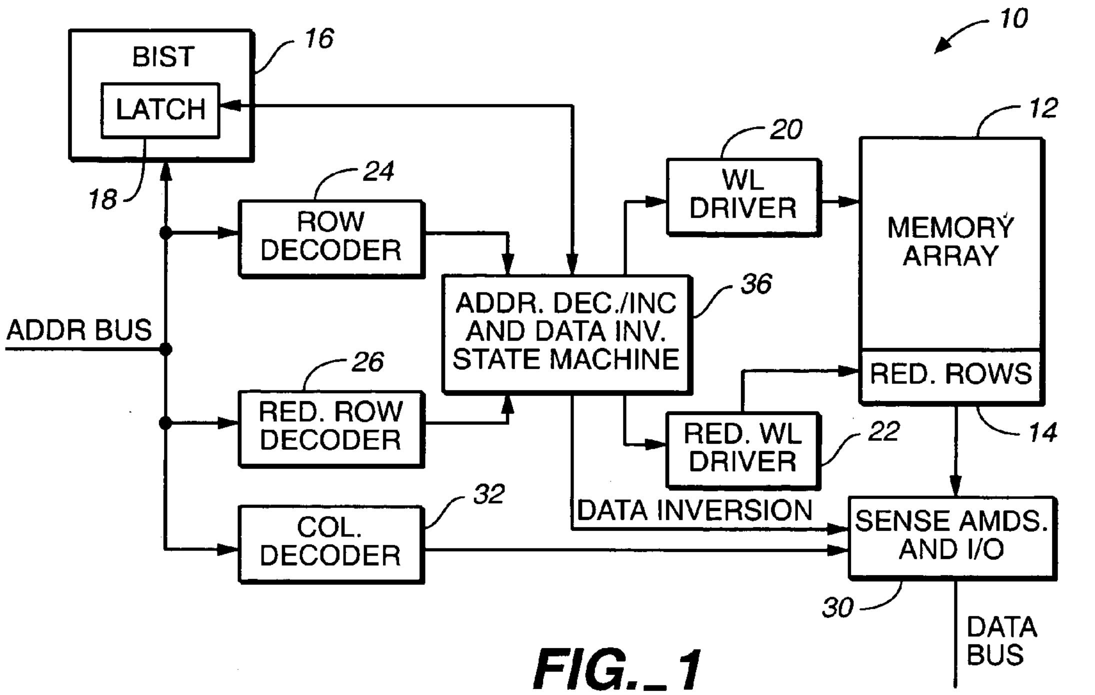
FIG._1
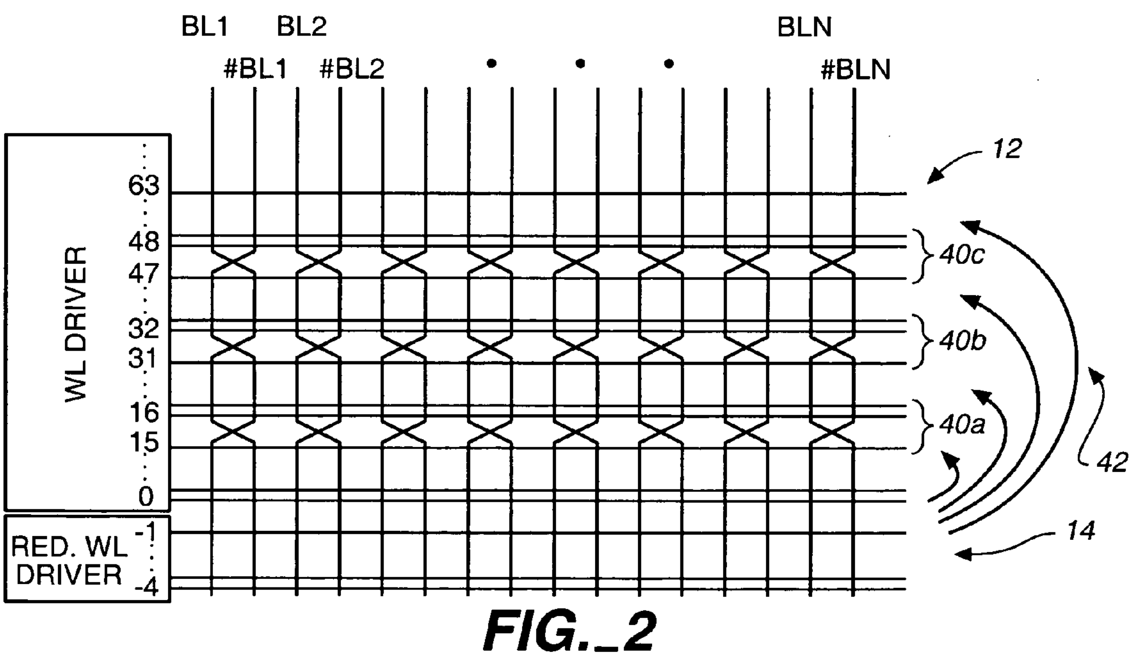
FIG._2

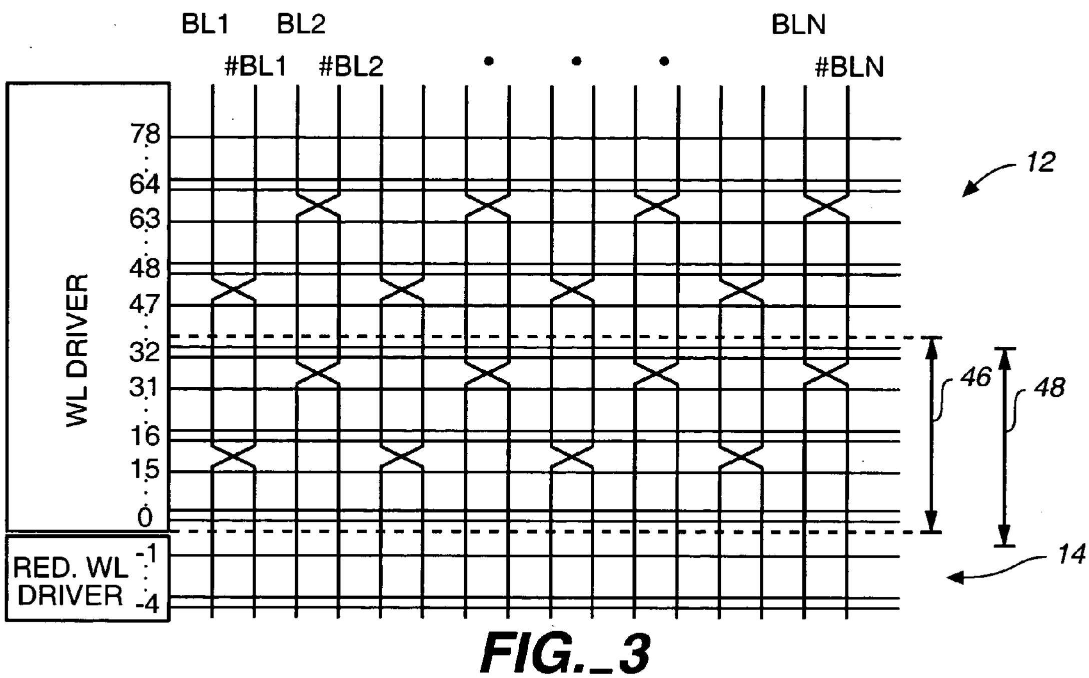
FIG._3
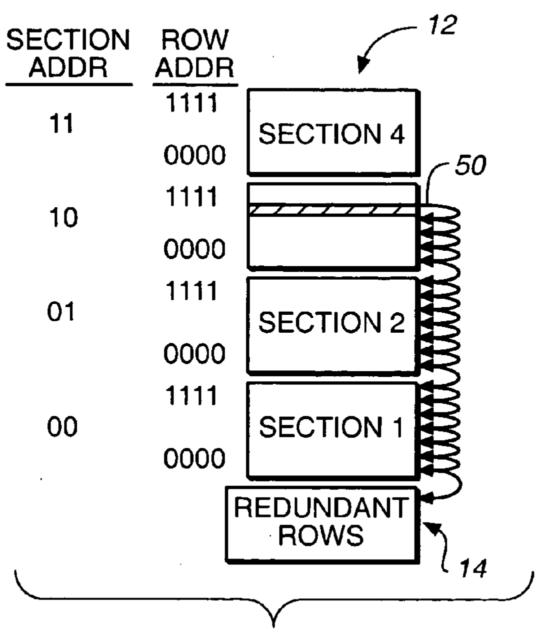
FIG._4A
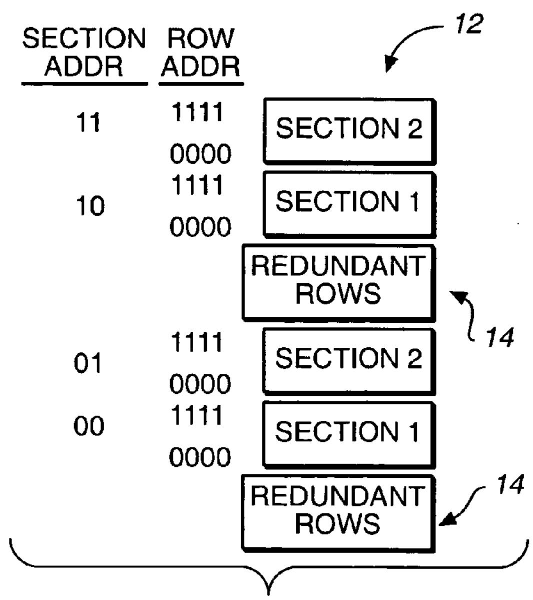
FIG._4B

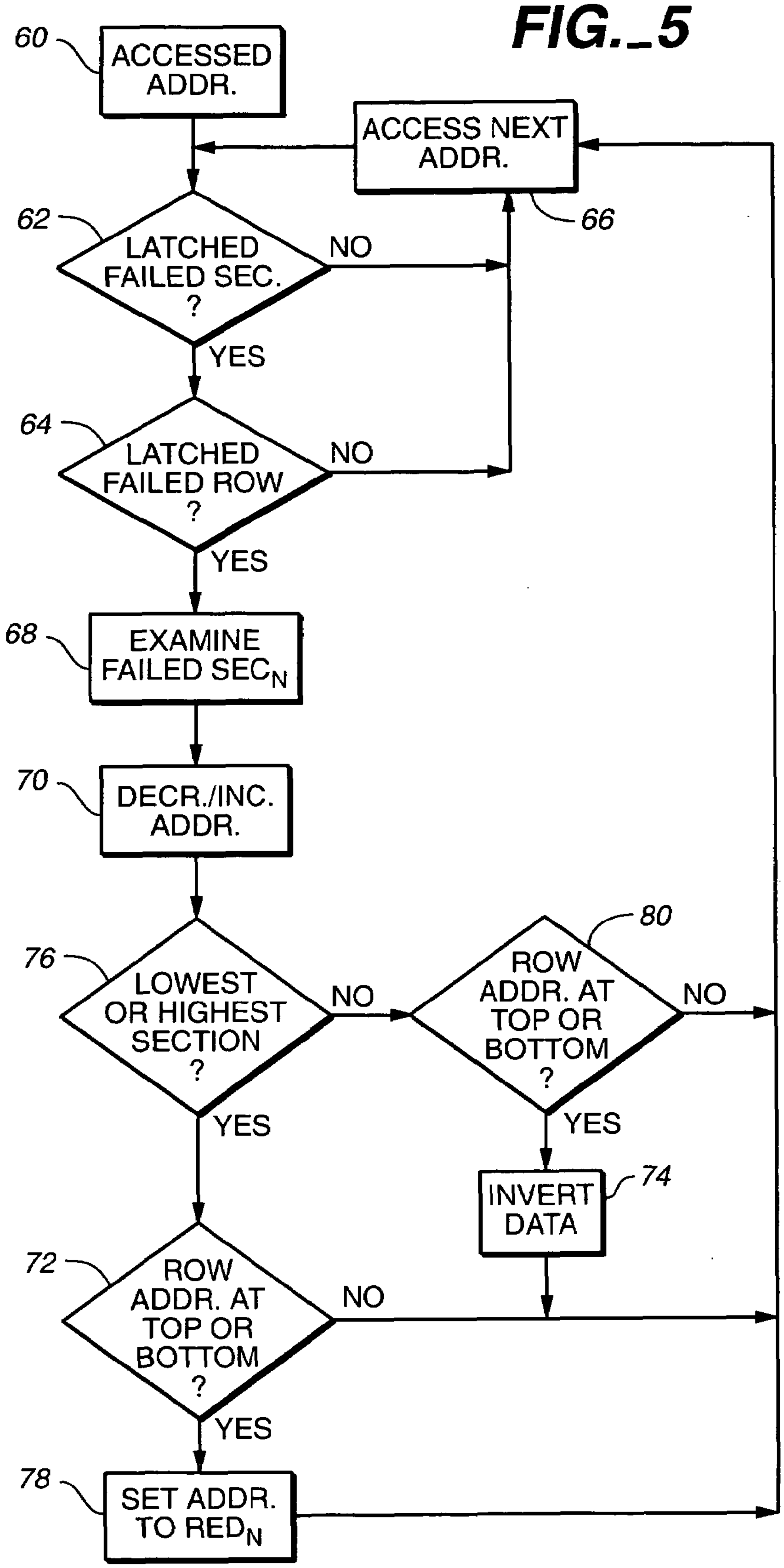
FIG._5

METHOD AND APPARATUS FOR REPLACING A DEFECTIVE CELL WITHIN A MEMORY DEVICE HAVING TWISTED BIT LINES

BACKGROUND OF THE INVENTION

1. Field of Invention

This invention relates to semiconductor memory and, more particularly, to repairing semiconductor memory having twisted bit lines by decrementing or incrementing addresses across at least one group of word line rows of memory (i.e., a section made up of memory rows) and inverting the data within storage cells of a row at the twisted bit line boundaries to replace the defective row with a redundant row for each defective row of memory within all sections of word line rows.

2. Description of Related Art

The following descriptions and examples are not admitted to be prior art by virtue of their inclusion within this section.

Semiconductor memory is a crucial resource in modern computer systems, and is typically used for data storage and program execution. Semiconductor memory is generally connected to an execution unit by a memory bus, where the memory elements are arranged upon one or more monolithic substrates. In many computer systems, semiconductor memory can be embedded on the same monolithic substrate as that which contains the execution unit. Such embedded memory is oftentimes referred to as on-chip instruction or data cache.

Regardless of where the semiconductor memory resides relative to the execution unit, conventional memory design utilizes an array of storage cells. For example, a word line can access a row of storage cells, and information can be written to and read from separate columns of cells via bit lines.

The magnitude of voltage stored in each cell can be fairly small. The stored voltage must be detected by the change in voltage it induces on the bit line when the bit line is coupled to, for example, a storage capacitor. Any electronic noise near the bit line can induce changes in voltage on the bit line. These changes might interfere with the detection of the stored charge and, thus, lead to errors when reading information from the semiconductor memory.

There are several approaches used to minimize the effects of noise on the bit lines. For example, the semiconductor memory can be spaced from the noise source or, alternatively, the memory can be placed in an isolation well to isolate the stored charge from the noise source. Still further, the bit lines can be folded. Folded bit lines involves using two bit lines rather than one, and forming differential signals on the bit line pairs. The true and complementary bit line of each bit line pair are routed alongside each other, and any noise placed onto the bit lines is assumed to couple equally on both. Various common-mode rejection techniques attributed to the differential signal cancel the noise upon the bit line pairs so that only the voltage difference is measured.

The assumption that noise couples equally upon each of the true and complementary bit lines is not always accurate, however. Since the folded bit lines run parallel to each other across the entire array, noise from an adjacent pair might impact, for example, the true bit line more so than the complementary bit line if the true bit line is closer to that adjacent pair. A further enhancement to the folded bit line architecture was thereby devised to compensate for signal coupling from adjacent bit line pairs. This improvement is oftentimes referred to as "twisted" bit line architecture.

Twisted bit line architecture involves placing periodic twists in each bit line pair as the bit line pair proceeds across the array of cells. For example, the true and complementary bit lines of a pair are arranged so they periodically switch position with one another—i.e., are twisted. The true and complementary bit lines are thereby inverted in locations every n number of storage cells. The true bit line might start at the left-side conductor at the top of the array and, as it proceeds downward past n cells, it is routed to the right side of the pair. Conversely, the complementary bit line might start at the right side of the pair and, after traversing n cells, is routed to the left side of the pair. In the region at which the true and complementary bit lines change position (i.e., twist), a space will exist between neighboring rows of storage cells. This space will constitute a boundary between n rows and is henceforth referred to as the "twist region."

While folded bit line and twisted bit line architectures help minimize the effects of noise placed on the low-margin signals of the bit lines, periodically switching the bit line positions proves disadvantageous when attempting to introduce redundant rows of memory cells into the array. For example, data inversion is one problem that may occur when re-mapping defective rows to redundant rows of memory when using an array having twisted bit lines. For example, if the data read from a bit line pair having the true bit line on the left side and the complementary bit line on the right side, the data will be inverted from data read from the same bit line pair with the complementary bit line on the left side and the true bit line on the right side. Depending on where the true and complementary bit lines exist for a particular row within the array relative to where the true and complementary bit lines exist within a redundant row, built-in-self-repair (BISR) will be impacted.

In an effort to account for the inversion issue, many manufacturers allocate redundant rows to each group of rows between twist regions. This BISR architecture will, therefore, allow redundancy to be taken care of "local" to the failed row. Also, since the failed row has the same bit line pair orientation as the redundant row, the data inversion problem is eliminated. However, adding redundant rows to each group of rows, where possibly numerous groups are associated with a memory array, can consume considerable layout area. The added memory array height will deleteriously increase the load attributed to each bit line. The added load will significantly degrade the overall response time of the bit line, thereby impacting the memory access time.

A BISR architecture is needed that avoids having to place redundant rows within each group of rows between twist regions. The desired BISR architecture must, however, account for the data inversion issue, yet avoid substantially increasing the overall array size. Accordingly, the improved BISR architecture must efficiently utilize the replacement rows without adding an undue number of rows within a twisted bit line array.

SUMMARY OF THE INVENTION

The problems outlined above are in large part solved by the present semiconductor memory. The present memory encompasses any memory having an array of storage cells accessed by a plurality of word lines. Signals are placed onto or read from the array using true and complementary bit line pairs, similar to the folded bit line architecture. In addition, each of the bit line pairs undergoes a twist within a twist region between groups of storage cell rows. It is preferred that the number of rows within each group is consistent so that the twist region appears at a regular and periodic interval within each bit line pair.

Instead of placing one or more redundant rows within each group of rows between twist regions, the present memory employs a redundancy scheme that uses only one set of redundant rows placed adjacent each other for the entire memory array. The redundant rows are preferably situated as a contiguous set of addresses either at the lowest addressable region or the highest addressable region of the memory array. Alternatively, the set of contiguous redundant row addresses can be possibly near the middle of the addressable region of the array. Whenever a defect is discovered, the defective row is re-mapped to the neighboring row address, and all of the successive rows beginning with the neighboring row are re-mapped to the respective next address location. This will cause the addresses to essentially "shift" one address location during the re-map procedure. The last address to which re-map occurs will, therefore, be a redundant row. Re-mapping can occur to the higher successive neighboring row or to the lower successive neighboring row depending on where the redundant row resides.

Alternatively, remapping can occur to both higher and lower addresses to encompass a redundant row placed at an address midpoint of the array. For example, re-mapping would occur to the lower successive address if the redundant row is at the lowest addressable region. Conversely, re-mapping would occur to the higher successive address if the redundant row is at the highest addressable region. Regardless of whether re-mapping occurs to the highest, lowest, or highest and lowest redundant rows, preferably all redundant rows exists as a contiguous set of rows for two or more groups or sections throughout the entire array.

As the re-mapping mechanism essentially shifts the address to the neighboring row, account must be taken of an address that shifts across a twist region. Whenever an address is incremented or decremented across a twist region, the data for that addressable row must be inverted. Therefore, the state machine that keeps track of twist region crossings must also assign a data inversion signal to each of those addresses whenever they are accessed. The data inversion signal will, therefore, be sent to the column decoders attributed to the input/output buffers of the memory array.

According to one embodiment, a method is provided for accessing an array of memory cells arranged as a plurality of rows and columns. The method includes receiving an address corresponding to a defective row having a defective memory cell. The defective row is essentially disconnected from the true and complementary bit line pairs. True and complementary bit line pairs are periodically interchanged in location within the twist region. Thus, the true and complementary bit line pairs interchange in the twist region between groups of the plurality of rows. A row neighboring the defective row is then connected at the address of the disconnected and defective row, and all rows succeeding the neighboring row are connected to the true and complementary bit line pairs. A redundant row, possibly neighboring the entire array of memory cells, can then be connected to the true and complementary bit line pairs. Data at the boundary between groups of the plurality of rows is thereby inverted. Essentially, the rows and redundant rows are connected by shifting the address value of the defective row and all successive rows to the next address value.

According to another embodiment, a semiconductor memory is provided. Semiconductor memory includes an array of memory cells and a plurality of true and complementary bit line pairs. The bit line pairs are twisted in locations at a boundary between groups of the plurality of rows. Circuitry is used for replacing a row among the plurality of rows having a defective memory cell with another row among the plurality of rows having the next lower (or upper) address value, and inverting the data at the boundary between the groups. The circuitry can either decrement or increment the address by one address location, including at least the first redundant row within the redundant array of memory cells. A data inverting circuit inverts the data received from an addressed row at a boundary between groups of rows. Depending on whether the re-mapped addresses are incremented or decremented, the address for the inverted data can be immediately below or above the twist region proceeding the re-mapping operation.

BRIEF DESCRIPTION OF THE DRAWINGS

Other objects and advantages of the invention will become apparent upon reading the following detailed description and upon reference to the accompanying drawings in which:

FIG. 1 is a block diagram of a semiconductor memory system with BIST and BISR capabilities;

FIG. 2 is a plan diagram of the word line and redundant word line drivers and a portion of the memory array of FIG. 1, showing the true and complementary bit lines periodically twisted at regular intervals throughout each bit line pair;

FIG. 3 is a plan diagram of the word line and redundant word line drivers and a portion of the memory array of FIG. 1, showing the true and complemeritary bit lines periodically twisted at less regular intervals than the embodiment of FIG. 2;

FIG. 4*a* is a plan diagram of a set of redundant word line rows reserved for replacement of four or more sections of word line rows within the useable, main memory array;

FIG. 4*b* is a plan diagram of a set of redundant word line rows reserved for replacement of no more than two sections of word line rows within the useable, main memory array according to another embodiment, to accommodate a less efficient replacement methodology than FIG. 4*a*; and FIG. 5 is a flow diagram illustrating operation of the address decrementing/incrementing and data inverting state machine of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a block diagram of semiconductor memory device 10. Memory 10 comprises a memory array 12 made up of storage cells arranged in rows and columns. In addition to array 12, another array of storage cells can be reserved as a set of redundant rows 14. The combination of memory array 12 and redundant rows 14 forms any type of semiconductor memory device that includes storage cells arranged in an array which are accessible by word lines and data placed into and from the array by bit lines. An example of such a memory array includes dynamic random access memory (DRAM).

In addition to memory array 12 and redundant rows 14, semiconductor memory 10 also comprises a BIST circuit 16. BIST 16 is coupled to memory array 12 to test for defective row and I/O memory lines, if any, in array 12. BIST 16 preferably contains a test pattern generator for generating a test pattern to verify the integrity of a memory cell. Hopefully, the test pattern written into array 12 will match the test pattern read from array 12. If not, the cells that demonstrate a difference will be kept track of. Specifically, the defective cells will be attributed to a row of cells and an address assigned to that row. Each defective row and corresponding address will be stored in latch 18. The stored defective row addresses will thereafter be used as part of a BISR procedure for replacing the defective rows by rows within the redundant row portion 14. The general concepts of programming, reading from, and writing to an array are fairly well known and will not be discussed. Moreover, the operation of BIST to detect an erroneous storage cell and BISR to re-map redundant rows into defective memory array rows are also generally well-known and will not be discussed, except for specific details of re-mapping across groups of rows separated by twist regions, described herein below.

In order to access memory array 12 and redundant rows 14, memory device 10 also includes a word line driver 20 and a redundant word line driver 22. Drivers 20 and 22 drive the appropriate voltage values upon the word lines of the corresponding rows of storage cells depending on the address decoded by row decoder 24 and redundant row decoder 26, respectively. Decoders 24 and 26 receive an address from, for example, a memory bus and decode that address to determine which one of the rows within array 12 must be accessed by corresponding word line driver 20. The row and redundant row decoder blocks can be thought of as a single block, however, with addresses that are re-mapped to the redundant rows 14 being decoded by the redundant row decoder portion, and the ensuing decoded signal being sent to redundant word line driver 22. Once the appropriate word line is driven onto memory array 12 or redundant rows 14, sense amplifiers 30 sense the voltage values on the bit lines. If a particular column is to be read or written to, then column decoder 32 will strobe the appropriate address onto the sense amplifier and/or I/O circuits of block 30.

Semiconductor memory 10 can be embodied upon a single integrated circuit, possibly along with an execution unit. Alternatively, semiconductor memory can be placed on the same integrated circuit or among numerous integrated circuits separate and apart from the execution unit. In whatever form, however, semiconductor memory 10 also includes a state machine 36 to perform various functions and features of address re-mapping and data inversion, better described in reference to FIGS. 2–5.

State machine 36 functions to receive failed row information stored within latch 18 and compares the addresses of the failed rows to the addresses received by the address bus. If the failed rows are to be accessed, then state machine 36 will cause the address targeted for the failed row to increment or decrement to the neighboring addressable row. All other neighboring rows at the higher (or lower) addressable region undergo an address shift by one address value. Eventually, the first row within the redundant rows 14 will be addressed so that essentially all addresses between the defective row and the first row of the redundant rows will be shifted by one address value. This allows the defective row to be re-mapped according to the present BISR mechanism.

In addition, rows that are re-mapped across a twist region output data that is inverted. The addresses that re-map across a twist boundary are kept track of within state machine 36 and, whenever those addresses are being accessed, a data inversion signal is sent to the I/O circuit 30 from state machine 36. This causes data read from the twist boundary rows to be inverted.

FIG. 2 illustrates one example in which true ($BL_i$) and complementary ($\#BL_i$) folded bit lines are twisted periodically as the bit lines traverse multiple rows within memory array 12. As shown in the example, there are three twist regions **40*a*, 40*b*, and 40*c*. If there are four groups of rows separated by three twist regions, each group can have n rows. In the example, n equals 16. Certainly, n can be greater than or less than 16 and the number of twist regions 40 can be fewer or greater than three. However, if four groups of rows are presented then, according to a conventional redundancy scheme, the redundant rows are distributed to each of the four groups, as shown by arrows 42**. Thus, if there are four redundant rows, one redundant row can be attributed to each group.

Most likely, if the number of rows within a group is fairly large, then two or more redundant rows must correspond to each group. This substantially reduces the efficiency of the redundancy scheme and increases the overall array size and bit line loading. Instead, it is preferred that the redundant rows 14 be contiguous to one another and placed in a particular addressable region relative to memory array 12. If re-mapping is to occur, then re-mapping takes place using an address incrementing/decrementing technique across multiple groups of rows. Any data conversions needed for rows that traverse twist regions 40 during the incrementing/decrementing operation must be inverted.

Depending on how often twisting is performed, it may be desirable to stagger the twist regions among neighboring bit line pairs, as shown in FIG. 3. Provided the bit lines are twisted at regular intervals essentially any twisted bit line architecture is contemplated. Instead of dispersing the redundant rows among each group of rows, redundant rows 14 are shown in a separate addressable region from array 12. If, for example, a defect is detected at address "43," the addressable region 46 is effectively shifted downward by one address value to form addressable region 48. In other words, an address to row 43 will produce an address to row 42, an address to row 42 will produce an address to row 41, and so on. Moreover, an address to row "0" will produce a re-mapping to the first neighboring address of redundant rows 14 (i.e., address "−1"). Thus, a defect at address 43 will produce a re-mapping of address 43 to address 42, and essentially shift the block of addresses 46 (addresses 0 to 43) to block 48 (addresses −1 to 42). The mechanics of decrementing the address by one address value and subsuming the first address within the redundant rows to perform BISR can equally apply to increasing the addresses by one address value if the redundant rows 14 are adjacent the highest addressable values within array 12.

FIGS. **4*a* and 4*b* illustrate alternative arrangement of redundant rows relative to various row groupings or sections within array 12. For example, FIG. 4*a* illustrates one set of redundant rows 14 for an entire array that may consist of four or more sections. Alternatively, redundant rows 14 may possibly be attributed only to half the sections within array 12 or only two sections within array 12, as shown in FIG. 4*b*. The most efficient arrangement of redundant rows relative to rows within array 12** is to use as few redundant rows per array rows as possible. Therefore, if only one set of redundant rows is attributed to the entire array made up of multiple sections, this arrangement affords the highest efficiency and, thus, is more preferred than the lower efficiency arrangements. However, either the higher or lower efficiency arrangement is suitable provided re-mapping occurs through address shifting by one address value and data inversion occurs when addresses shift across a twist region.

FIG. 4*a* illustrates the downward shifting by one address value beginning at address 43, as shown by arrows 50. In addition to the downward shifting mechanics, FIGS. 4*a* and 4*b* also illustrate indirect addressing of a row within each section. When an address arrives upon the memory bus, the address is compared to addresses stored in the BIST latch. The BIST latch stores defective rows and, more particularly, the addresses of those rows using section and row address fields. The incoming address can be compiled into section and row addresses and thereafter compared against the defective section and row addresses stored within the latch. Accordingly, for the example shown in FIG. 4*a*, a defective address "43" constitutes a section address having a binary value "10" and a row address of binary value "1011." Section addresses 00 through 11 will capture all sections within the array if only four sections occur. However, if more than four sections are used (i.e., more than three twist regions occur), then the section addressing field can add all the necessary bits to encompass however many sections are needed. The same can be said for the row-addressing field: depending on the number of rows within the group, the row-addressing field can increase or decrease as needed.

FIG. 5 illustrates the algorithm by which state machine 36 (FIG. 1) carries out the address decrementing/incrementing operation as well as data inversion signaling to the I/O section. Specifically, FIG. 5 indicates a sequence of steps undertaken whenever an address is accessed, beginning with block 60. The section address field of the address can then be compared 62 to the section address discovered by the BIST engine as a failure and stored within the latch of the BIST engine. If the section field compares to the failed section address, then the row field of the accessed address is compared 64 to the latched failed row. If the accessed address is above the failed row for implementations with the redundant rows at the bottom, or below the failed row for implementations with the redundant rows at the top, then the next address can be accessed, as shown by block 66. Thus, a failure to compare against a failed row simply constitutes normal operation without any BISR function.

However, if the accessed address matches the latched section and row addresses, or is below the failed row for implementations with the redundant rows at the bottom or above the failed row for implementations with the redundant rows at the top, then one must examined the failed section 68. The failed section can be any section within the possible multiple sections of the array or multiple sections assigned to a particular set of redundant rows. For example, the failed section might be section N (i.e., $SEC_N$). Once the failed section is determined, then beginning with the failed row, addresses for that row are incremented or decremented 70 to the neighboring row. If the address is not in a section nearest the redundant rows 76, and the address is at the boundary of the particular section or group 80, then the data associated with that row as it is being re-mapped across the twist region must be tracked and inverted 74. If the address is in the section nearest the redundant rows 76, and the address is at the boundary of that section or group 72, then the address will be re-mapped 78 to the first redundant row ($RED_N$) that neighbors that section.

The flow diagram of FIG. 5 can be easily and readily applied to a set of instructions executable by the state machine of FIG. 1. The state machine will then carry out the appropriate re-mapping to the word line and redundant word line drivers. In addition, data inversion for addresses that cross the twist region will also be accomplished and forwarded to the appropriate I/O circuitry of the memory device. It is understood that there can be slight modifications to the various steps shown, as well as the component circuitry for carrying out those steps. However, it is recognized that such modifications and alternative embodiments which maintain the general concepts hereof will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for accessing an array of memory cells arranged as a plurality of rows and columns, comprising:

receiving an address corresponding to a defective row having a defective memory cell;

disconnecting the defective row from true and complementary bit line pairs, each of which is coupled to a respective column of the plurality of columns and periodically interchanged in location at a boundary between groups of the plurality of rows;

connecting a row neighboring the defective row and all rows succeeding the neighboring row to the true and complementary bit line pairs;

connecting a redundant row neighboring the array of memory cells to the true and complementary bit line pairs; and inverting data at the boundary between groups of the plurality of rows.

2. The method as recited in claim 1, wherein said connecting a row comprises replacing the defective row and all succeeding rows within the array with the neighboring row and all rows succeeding in address value the neighboring row address value.

3. The method as recited in claim 1, wherein said succeeding comprises all address values below an address value of the neighboring row.

4. The method as recited in claim 1, wherein said succeeding comprises all address values above an address value of the neighboring row.

5. The method as recited in claim 1, wherein said inverting comprises inverting the logic value of the data within a row neighboring the boundary.

6. The method as recited in claim 1, wherein said connecting a row and connecting a redundant row comprises shifting the address value of the defective row and all successive rows to the next address value, either upward or downward, to include a redundant row address for each defective row.

7. A semiconductor memory, comprising:

an array of memory cells arranged as a plurality of rows and columns;

a plurality of true and complementary bit line pairs, each of which is coupled to a respective column of the plurality of columns and periodically interchanged in location at a boundary between groups of the plurality of rows; and circuitry for replacing a row among the plurality of rows having a defective memory cell with another row among the plurality of rows having the next lower address value and inverting the data at the boundary between the groups.

8. The semiconductor memory as recited in claim 7, further comprising a built-in-self-test (BIST) circuit that detects the row having the defective memory cell and stores an address of said row within a latch.

9. The semiconductor memory as recited in claim 7, wherein the circuitry comprises an address decrementing circuit that (i) substitutes the next lower address value for the address of the row having the defective memory cell, and (ii) substitutes the next lower address value for each of the addresses lower than the row having the defective memory cell.

10. The semiconductor memory as recited in claim 7, wherein the boundary separates a pair of rows within the plurality of rows, and wherein one of the pair of rows has an address at the next higher address value than the other of the pair of rows.

11. The semiconductor memory as recited in claim 10, wherein the circuitry comprises:

an address decrementing circuit that decrements an address of said one of the pair of rows to an address of said another of the pair of rows; and a data inverting circuit that receives data from each row among the plurality of rows and inverts the data within said one of the pair of rows.

12. The semiconductor memory as recited in claim 7, further comprising a plurality of redundant rows of memory cells.

13. The semiconductor memory as recited in claim 12, wherein the circuitry comprises a replacement circuit that replaces a lowest addressable row among the plurality of rows with a highest addressable row among the plurality of redundant rows.

14. A semiconductor memory, comprising:

an array of memory cells arranged as a plurality of rows and columns;

a plurality of true and complementary bit line pairs, each of which is coupled to a respective column of the plurality of columns and periodically interchanged in location at a boundary between groups of the plurality of rows; and circuitry for replacing a row among the plurality of rows having a defective memory cell with another row among the plurality of rows having the next higher address value and inverting the data at the boundary between the groups.

15. The semiconductor memory as recited in claim 14, further comprising a built-in-self-test (BIST) circuit that detects the row having the defective memory cell and stores an address of said row within a latch.

16. The semiconductor memory as recited in claim 14, wherein the circuitry comprises an address incrementing circuit that (i) substitutes the next higher address value for the address of the row having the defective memory cell, and (ii) substitutes the next higher address value for each of the addresses higher than the row having the defective memory cell.

17. The semiconductor memory as recited in claim 14, wherein the boundary separates a pair of rows within the plurality of rows, and wherein one of the pair of rows has an address at the next lower address value than the other of the pair of rows.

18. The semiconductor memory as recited in claim 17, wherein the circuitry comprises:

an address increasing circuit that increases an address of said one of the pair of rows to an address of said another of the pair of rows; and a data inverting circuit that receives data from each row among the plurality of rows and inverts the data within said one of the pair of rows.

19. The semiconductor memory as recited in claim 14, further comprising a plurality of redundant rows of memory cells.

20. The semiconductor memory as recited in claim 19, wherein the circuitry comprises a replacement circuit that replaces a highest addressable row among the plurality of rows with a lowest addressable row among the plurality of redundant rows.

* * * * *